(12) United States Patent
Yu et al.

(10) Patent No.: US 12,019,025 B2
(45) Date of Patent: Jun. 25, 2024

(54) APPARATUS AND METHOD FOR PREPARING GLOW DISCHARGE SPUTTERING SAMPLES FOR MATERIAL MICROSCOPIC CHARACTERIZATION

(71) Applicant: NCS Testing Technology CO., LTD, Beijing (CN)

(72) Inventors: Xing Yu, Beijing (CN); Haizhou Wang, Beijing (CN); Xuejing Shen, Beijing (CN); Xiaojia Li, Beijing (CN); Yifei Zhu, Beijing (CN); Weihao Wan, Beijing (CN); Yuhua Lu, Beijing (CN); Hui Wang, Beijing (CN); Qun Ren, Beijing (CN); Yongqing Wang, Beijing (CN); Zhenzhen Wan, Beijing (CN)

(73) Assignee: NCS Testing Technology CO., LTD, Beijing (CN)

( * ) Notice: Subject to any disclaimer, the term of this patent is extended or adjusted under 35 U.S.C. 154(b) by 0 days.

(21) Appl. No.: 17/315,235

(22) Filed: May 7, 2021

(65) Prior Publication Data
US 2022/0205922 A1    Jun. 30, 2022

(30) Foreign Application Priority Data
Sep. 11, 2020    (CN) .......................... 202010951252.8

(51) Int. Cl.
*G01N 21/67*    (2006.01)
*C23C 14/34*    (2006.01)
(Continued)

(52) U.S. Cl.
CPC .......... *G01N 21/67* (2013.01); *C23C 14/3435* (2013.01); *H01J 49/0459* (2013.01); *H01J 49/06* (2013.01); *H01J 49/12* (2013.01)

(58) Field of Classification Search
CPC ...... G01N 21/67; G01N 1/28; C23C 14/3435; H01J 49/0459; H01J 49/06; H01J 49/12; H01J 37/32018
See application file for complete search history.

(56) References Cited

U.S. PATENT DOCUMENTS 4,367,427 A * 1/1983 Grimm ............. G01J 3/10
                                                313/32
5,172,183 A * 12/1992 Mega .............. G01N 21/67
                                                356/311
(Continued)

FOREIGN PATENT DOCUMENTS

CN    102829732 A  * 12/2012
CN    109884104 A  * 6/2019 ............. C23C 14/34

OTHER PUBLICATIONS

CN-109884104-A Translation (Year: 2019).*
CN-102829732-A Translation (Year: 2012).*

*Primary Examiner* — Nicholas A Smith
*Assistant Examiner* — Patrick S Ott
(74) *Attorney, Agent, or Firm* — Zhigang Ma

(57) ABSTRACT

An apparatus and a method for preparing glow discharge sputtering samples for materials microscopic characterization are provided. The apparatus includes a glow discharge sputtering unit, a glow discharge power supply, a gas circuit automatic control unit, a spectrometer, and a computer. The structure of the glow discharge sputtering unit is optimized to be more suitable for sample preparation by simulation. By adding a magnetic field to the glow discharge plasma, uniform sample sputtering is realized within a large size range of the sample surface. The spectrometer monitors multi-element signal in a depth direction of the sample sputtering, so that precise preparation of different layer microstructures is realized. In conjunction with the acquisition of the sample position marks and the precise spatial (Continued)

coordinates (x, y, z) information, the correspondence between the surface space coordinates and the microstructure of the sample is conveniently realized.

15 Claims, 6 Drawing Sheets

(51) Int. Cl.
*H01J 49/04* (2006.01)
*H01J 49/06* (2006.01)
*H01J 49/12* (2006.01)

(56) References Cited

U.S. PATENT DOCUMENTS

| | | | | |
|---|---|---|---|---|
| 5,184,016 A | * | 2/1993 | Ronan | G01N 21/67 |
| | | | | 250/288 |
| 5,307,568 A | * | 5/1994 | Matsuo | H01J 37/32871 |
| | | | | 34/92 |
| 2008/0217294 A1 | * | 9/2008 | Ko | H01J 37/32091 |
| | | | | 216/57 |
| 2015/0240359 A1 | * | 8/2015 | Jdira | C23C 16/45561 |
| | | | | 137/561 A |
| 2017/0322161 A1 | * | 11/2017 | Farkas | G01N 21/67 |
| 2018/0266960 A1 | * | 9/2018 | Fujimoto | G01N 21/01 |

* cited by examiner

APPARATUS AND METHOD FOR PREPARING GLOW DISCHARGE SPUTTERING SAMPLES FOR MATERIAL MICROSCOPIC CHARACTERIZATION

TECHNICAL FIELD

The present disclosure relates to the technical field of materials analysis and characterization, and more specifically, to an apparatus and a method for preparing glow discharge sputtering samples for materials microscopic characterization.

BACKGROUND

Currently, sample preparation technologies such as mechanical polishing, electropolishing and focused ion beam (FIB) used for materials microscopic characterization have disadvantages such as long-time consumption, damage to the surface of the sample, uncontrollable polishing conditions, small area of preparation, and high cost, and cannot fully satisfy the requirements for large size, overall and real information acquisition of the sample microstructure.

Glow discharge belongs to a low-pressure gas discharge as an effective atomization and excitation light source for elemental analysis of solid materials. Sample atoms are peeled off layer-by-layer from the surface of the sample by cathode sputtering, and enter a glow discharge plasma to be excited and ionized, and a sputtering crater with an almost flat bottom can be formed on the surface of the sample, which can well satisfy the requirements of preparing sample for microscopic characterization of materials. The light source of the direct current (DC) mode or of the radio frequency (RF) mode can be quickly stabilized. The glow discharge has a very high depth resolution (up to nm level), has many applications in the analysis of the nano surface layer and the composite layer, and can achieve the preparation of the sample layer-by-layer with high precision. Meanwhile, since the glow discharge sputtering region is large, it is possible to easily realize cm level sample preparation. Sample sputtering has a high exfoliation corrosion rate and can meet the requirements of fast preparation.

Glow discharge as a sample preparation means of microstructure characterization of materials begins preliminary attempts, such as the article entitled "Glow discharge plasma as a surface preparation tool for microstructure investigations", Materials Characterization, 2014, 91:76-88. In this article, a commercial glow discharge spectrometer (GDOES) is adopted. The commercial tool is designed for elemental analysis of solid materials, and mainly focuses on better excitation of sputtered sample atoms in glow discharge plasma, and is relatively irrespective or less considering the influence of glow discharge sputtering on the surface of the sample, particularly on the microstructure. The property of layer-by-layer exfoliation corrosion of the sample by glow discharge is not considered to achieve the controllable layer-by-layer preparation of the sample. Meanwhile, the diameter of the glow sputtering region is only 2.5 mm, which is small. Generally, if the microstructure characterization region of the structural materials reaches the cm level, the microstructure of the materials can be completely reflected. The research region in the article has deficiencies in randomness, and the microstructure of the materials cannot be reflected as a whole from a large range of dimensions.

In the prior art, there are some technical solutions for enhancing the signal intensity of glow discharge by the magnetic field, such as Chinese Patent Application No. 201810301634.9 "Device and method for enhancing ion signal intensity of radio frequency glow discharge mass spectrum by using annular magnetic field". Provided are a device and a method for using an annular magnetic field to enhance the intensity of a radio frequency glow discharge electrostatic spectrum ion signal to solve the problem that the signal intensity of the existing radio frequency glow discharge mass spectrum is low. The device includes a sampling device having a sampling rod and fixed with a ceramic gasket, an annular magnet reinforcement having a housing and an annular magnet. The annular magnet is placed in the housing, and the annular magnet reinforcement portion is fixed between the sampling rod and the ceramic gasket in the sampling device. In the device and method, the sample is embedded in an annular magnet, and the magnetic charging direction is parallel to the surface of the sample, so that the motion trajectory of the electrons is extended, thereby improving the sputtering rate and ionization efficiency of the sample. Meanwhile, the prior art uses a radio frequency glow discharge mass spectrometer to perform analytical detection, instead of using a glow discharge technology for sample preparation to realize layer-by-layer exfoliation corrosion of microstructures of materials.

Currently, the most commonly adopted means for performing layer-by-layer exfoliation corrosion of a materials microstructure is the focused ion beam (FIB) technology, which can realize micromachining in the region of the level of several tens of micrometers, and the machining accuracy is less than 5 nm, but at the same time, there are a lot of disadvantages such as small region, changed microstructure by an amorphized layer, long-time consumption (several hours), and high cost.

SUMMARY

In view of the above technical problem, an object of the present disclosure is to provide an apparatus for preparing glow discharge sputtering samples for materials microscopic characterization. The apparatus can perform layer-by-layer exfoliation corrosion of a materials microstructure, so as to realize large area, flat and rapid preparation of the samples. In the depth direction, a controllable layer-by-layer preparation of the sample is achieved, and is used for materials three-dimensional microstructure reconstruction.

Another object of the present disclosure is to provide a method for preparing glow discharge sputtering samples for materials microscopic characterization. By automatic regulation and control of the set optimized discharge conditions, in conjunction with the acquisition of the sample position marks and the precise spatial coordinates (x, y, z) information, not only the sample preparation of materials microstructure characterization is realized, but also the correspondence between the surface space coordinates and the microstructure of the sample is conveniently realized.

In order to achieve the above objects, the present disclosure provides the following technical solutions.

An apparatus for preparing glow discharge sputtering samples for materials microscopic characterization includes a glow discharge sputtering unit 1, a glow discharge power supply 2, a gas circuit automatic control unit 3, a spectrometer 4, and a computer 5.

The glow discharge sputtering unit 1 includes a cavity 6, a cathode plate 7, a magnet 8, a sealing ring 9, an insulating plate 10, an anode tube 11 and a ceramic tube 12.

A sample 13 is in airtight contact with the cathode plate 7 of the glow discharge sputtering unit 1 as a cathode, and the cavity 6 forms a closed discharge space.

The magnet 8 is annular and arranged outside the anode tube 11 through the ceramic tube 12, and the magnet 8 is located between the insulating plate 10 and the cathode plate 7.

A positive electrode and a negative electrode of the glow discharge power supply 2 are electrically connected to the cavity 6 of the glow discharge sputtering unit 1 and the sample 13, respectively.

The gas circuit automatic control unit 3 is connected to the cavity 6 of the glow discharge sputtering unit 1 via a gas pipeline, and evacuates the cavity 6 and introduces an inert discharge gas at a certain flow rate.

The spectrometer 4 is connected to the glow discharge sputtering unit 1 through a light guide device, and collects a spectral signal generated during the sample glow discharge sputtering in real time, and monitors an element signal condition in a depth direction of the sample sputtering, so that precise preparation of different layer microstructures is realized.

The computer 5 is respectively connected to the glow discharge power supply 2, the gas circuit automatic control unit 3 and the spectrometer 4, and is used for setting discharge parameters of glow discharge sputtering, collecting and displaying the discharge parameters during glow discharge sputtering and a gas pressure value in the cavity 6 of the glow discharge sputtering unit 1 in real time, and processing and displaying the spectral signal generated during the glow discharge sputtering of the sample and collected by the spectrometer 4 in real time.

A central axis of the magnet 8 coincides with a central axis of the anode tube 11. The direction of the magnetic force line of the magnet 8 is perpendicular to the surface of the sample 13. After a magnetic field and an electric field are applied, charged particles perform a spiral movement as follows: they make a circular motion perpendicular to the magnetic field, and move toward the surface of the sample 13 under the action of the electric field.

The glow discharge power supply 2 and the gas circuit automatic control unit 3 cooperatively adjust the gas pressure in the cavity 6 of the glow discharge sputtering unit 1, so that preset discharge parameter values are reached, and a stable sputtering and a flat sample preparation surface are obtained.

The glow discharge sputtering unit 1 is provided with a replaceable anode tube 11 with different diameters between 2 mm and 20 mm, so that the mm-cm level glow discharge sputtering sample preparation is realized.

The glow discharge power supply 2 is a direct current power source or a radio frequency power source. The direct current power source includes an excitation control system, a negative high voltage generation system and a constant current control system. And the radio frequency power source includes a radio frequency power source, a power matcher, and a radio frequency power automatic control system.

When the glow discharge power supply 2 is the direct current power source, the direct current high voltage generated by the negative high voltage generation system is used for glow discharge sputtering samples, and the set discharge voltage is monitored in real time. A DC constant current mode is adopted, and a value of the set discharge voltage is maintained by adjusting the gas pressure in the cavity 6 of the glow discharge sputtering unit 1 rapidly.

When the glow discharge power supply 2 is the radio frequency power source, the radio frequency power source applies a set radio frequency energy to the sample 13 via a cable. The glow discharge is generated and maintained by a self-bias voltage generated on the sample 13. The power matcher minimizes a reflected power by tuning. A value of the set discharge power is maintained in combination with adjusting the gas pressure in the cavity 6 of the glow discharge sputtering unit 1.

The gas circuit automatic control unit 3 includes a vacuum pump, a high pressure gas cylinder, a pressure relief valve, a vacuum gauge, an electromagnetic valve and a connecting pipe. The gas circuit automatic control unit 3 evacuates the cavity 6 of the glow discharge sputtering unit 1 by the vacuum pump. Meanwhile, through the control of the electromagnetic valve, the inert discharge gas with the set flow rate is released, so that the gas pressure in the cavity 6 of the glow discharge sputtering unit 1 reaches a dynamic balance.

Combined with a change of glow discharge spectrum signal over time collected by the spectrometer 4, a change relationship of each element content with depth in the process of sample preparation is obtained by the computer 5 through a quantitative conversion model.

The magnet 8 is a permanent magnet or an electromagnet.

The apparatus further includes a fluid simulation module. The fluid simulation module simulates a distribution of the gas pressure in the cavity 6 of the glow discharge sputtering unit 1. A gas inlet position, a gas inlet angle and a gas flow rate of the cavity 6 are optimized according to the simulation result, so that a non-uniformity of the distribution of the electric field in the glow discharge sputtering unit is counteracted, and a flat preparation of the sample surface in the size range of mm-cm level is realized.

The sealing ring 9 is provided on a contact surface between the cathode plate 7 and the sample 13.

The insulating plate 10 is made of ceramic, polytetrafluoroethylene or epoxy resin.

The gas pressure value in the cavity 6 is 100-1000 Pa.

A voltage between the cathode and the anode of the glow discharge sputtering unit 1 is 500-2000 V.

The flow rate of the inert discharge gas of the cavity 6 is 0.1-1.0 mL/min. A method for preparing glow discharge sputtering samples for materials microscopic characterization includes:

S1. Sample preparation: cutting the sample into a linear dimension of 10-50 mm, and grinding and polishing to obtain a flat and clean sample surface; wherein the linear dimension completely covers the anode tube of the glow discharge sputtering apparatus and the sealing O-ring on the cathode plate;

S2. Sample marking: positionally marking on the prepared sample by using a microhardness tester, and marking surface two-dimensional coordinates (x, y) of each point;

S3. Sample placement: using the sample 13 as a cathode; bringing the sample 13 into airtight contact with the cathode plate 7 of the glow discharge sputtering unit 1 by a sample jacking device to obtain a closed discharge space formed by the cavity 6; setting discharge parameters of glow discharge sputtering by the computer 5; evacuating the cavity 6 by the gas circuit automatic control unit 3 and introducing the inert discharge gas at a certain flow rate; providing a stable glow discharge energy for the sample 13 by the glow discharge power supply 2; making the middle axis of the magnet 8 coincide with the middle axis of the anode tube 11;

making the direction of the magnetic force line of the magnet 8 perpendicular to the surface of the sample 13; and after the magnetic field and the electric field are applied, making charged particles perform a spiral movement as follows: the particles make a circular motion perpendicular to the magnetic field, and move toward the surface of the sample 13 under the action of the electric field;

S4. Sample sputtering preparation: adjusting cooperatively, by the glow discharge power supply 2 and the gas circuit automatic control unit 3, the gas pressure in the cavity 6 of the glow discharge sputtering unit 1 to reach a preset discharge parameter value in the process of sample glow discharge sputtering; performing sample preparation according to required sputtering time; collecting and displaying, by the computer 5, the discharge parameters during glow discharge sputtering and a gas pressure value in the cavity 6 of the glow discharge sputtering unit 1 in real time;

S5. Signal acquisition and processing: collecting, by the spectrometer 4, the spectral signal generated during the sample glow discharge sputtering in real time; monitoring, by the spectrometer 4, the element signal condition in a depth direction of the sample sputtering to achieve precise preparation of different layer microstructures; processing and displaying, by the computer 5, the spectral signal generated during the glow discharge sputtering of the sample collected by the spectrometer 4 in real time;

S6. Sample surface preparation in different depth directions: repeating glow discharge sputtering at the same position according to requirements of materials microstructure characterization; and preparing sample surfaces with different depths for materials three-dimensional microstructure reconstruction.

In step S2, a width of the marking point is 5-100 μm, and a central coordinate of each marking point is accurately acquired by a microhardness tester.

In step S4, the method further includes:

simulating, by the fluid simulation module, the distribution of the gas pressure in the cavity 6 of the glow discharge sputtering unit 1; optimizing the gas inlet position, the gas inlet angle and the gas flow rate of the cavity 6 according to the simulation result; counteracting the non-uniformity of the distribution of the electric field in the glow discharge sputtering unit; and achieving the flat preparation of the sample surface in the size range of mm-cm level.

The gas pressure value in the cavity 6 is 100-1000 Pa.

The voltage between the cathode and the anode of the glow discharge sputtering unit 1 is 500-2000 V.

The flow rate of the inert discharge gas of the cavity 6 is 0.1-1.0 mL/min.

Combined with the change of glow discharge spectrum signal over time collected by spectrometer 4, the change relationship of each element content with depth in the process of sample preparation is obtained by the computer 5 through the quantitative conversion model.

The present disclosure adopts a glow discharge apparatus, by means of cathode sputtering, to erode the sample atoms layer-by-layer from the surface of the sample, thereby achieving the requirement of the sample preparation for the materials microstructure characterization. The apparatus can be used for relevant detection such as scanning electron microscopy and transmission electron microscopy. The gas pressure distribution inside the apparatus is simulated by the fluid simulation module. Considering the influence of the gas pressure distribution inside the glow discharge sputtering apparatus on the surface sputtering flatness of the sample preparation, the microstructure of the glow discharge apparatus for sputtering preparation is designed and optimized, such as the gas inlet position and the gas inlet angle of a discharge gas (argon gas). During glow discharge sputtering, by adding a magnetic field to the glow discharge plasma, the movement trajectory of the charged particles is changed, the movement path of the charged particles is increased, and more collisions with other particles occur, so that the charged particles are distributed more uniformly in the glow discharge plasma, and uniform sample sputtering is realized within a large size range of the sample surface. During the sample preparation of glow discharge sputtering, the relevant discharging parameters of the apparatus are optimized, and automatic control is realized, so that a flat sample preparation surface with a large size of mm-cm level is obtained. By using the feature of glow discharging to erode the sample layer-by-layer, the preparation of the sample layer-by-layer can be controlled in the depth direction, and in combination with the acquisition of the sample position marks and the precise spatial coordinates (x, y, z) information, the correspondence between the surface space coordinates and the microstructure of the sample is conveniently realized. Meanwhile, the glow discharge sputtering source is connected to the spectrometer, and the spectrometer collects the spectral signal generated during the sample glow discharge sputtering in real time, and monitors an element signal condition in a depth direction of the sample sputtering, so that precise preparation of different layer microstructures is realized. In combination with the change of collected glow discharge spectrum signal over time, a change relationship of each element content with depth in the process of sample preparation is obtained through a quantitative conversion model.

Compared with the prior art, the present disclosure has the following beneficial effects.

Compared with existing sample preparation technologies such as mechanical polishing, electropolishing, focused ion beam (FIB), etc., the present disclosure uses glow discharge sputtering to prepare a sample. The uniformity of the distribution of the charged particles in the glow discharge plasma is improved by the magnet, and the flatness of the sample surface sputtering within a large size range is improved. Flat and rapid (within minutes) preparation of mm-cm level large-sized samples can be performed. Controllable layer-by-layer multiple times preparation of samples is realized. And the sample microstructure is not damaged and the required cost is low. The requirements of sample preparation for materials microstructure characterization are achieved. The disclosure can be used for relevant detection such as scanning electron microscopy and transmission electron microscopy.

Figure 1:
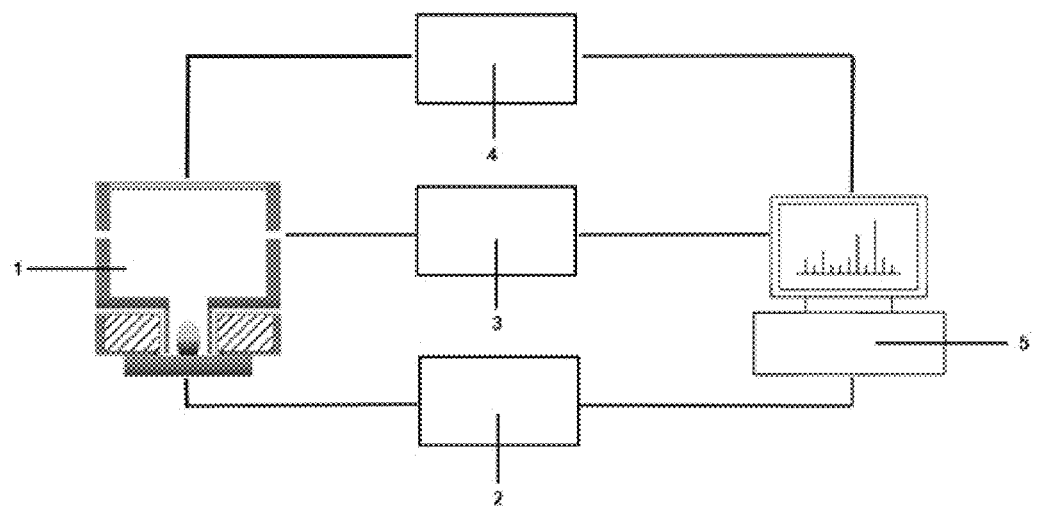
FIG. 1 is a structural schematic diagram of the apparatus for preparing glow discharge sputtering samples for materials microscopic characterization of the present disclosure.

Reference numerals therein are:
1 glow discharge sputtering unit
2 glow discharge power supply
3 gas circuit automatic control unit
4 spectrometer
5 computer
6 cavity
7 cathode plate
8 magnet
9 sealing O-ring
10 insulating plate
11 anode tube
12 ceramic tube
13 sample

DETAILED DESCRIPTION OF EMBODIMENTS

The present disclosure will be further described below with reference to the accompanying drawings and embodiments.

The apparatus for preparing glow discharge sputtering samples for materials microscopic characterization of the disclosure includes a glow discharge sputtering unit 1, a glow discharge power supply 2, a gas circuit automatic control unit 3, a spectrometer 4, and a computer 5. The glow discharge sputtering unit 1 is connected with the glow discharge power supply 2 through a cable. The glow discharge sputtering unit 1 is connected with the gas circuit automatic control unit 3 through a gas pipeline. The glow discharge sputtering unit 1 is connected with the spectrometer 4 through a light guide device (such as an optical fiber). And the glow discharge power supply 2, the gas circuit automatic control unit 3 and the spectrometer 4 are connected with the computer 5 through cables, as shown in FIG. 1.

Figure 4:
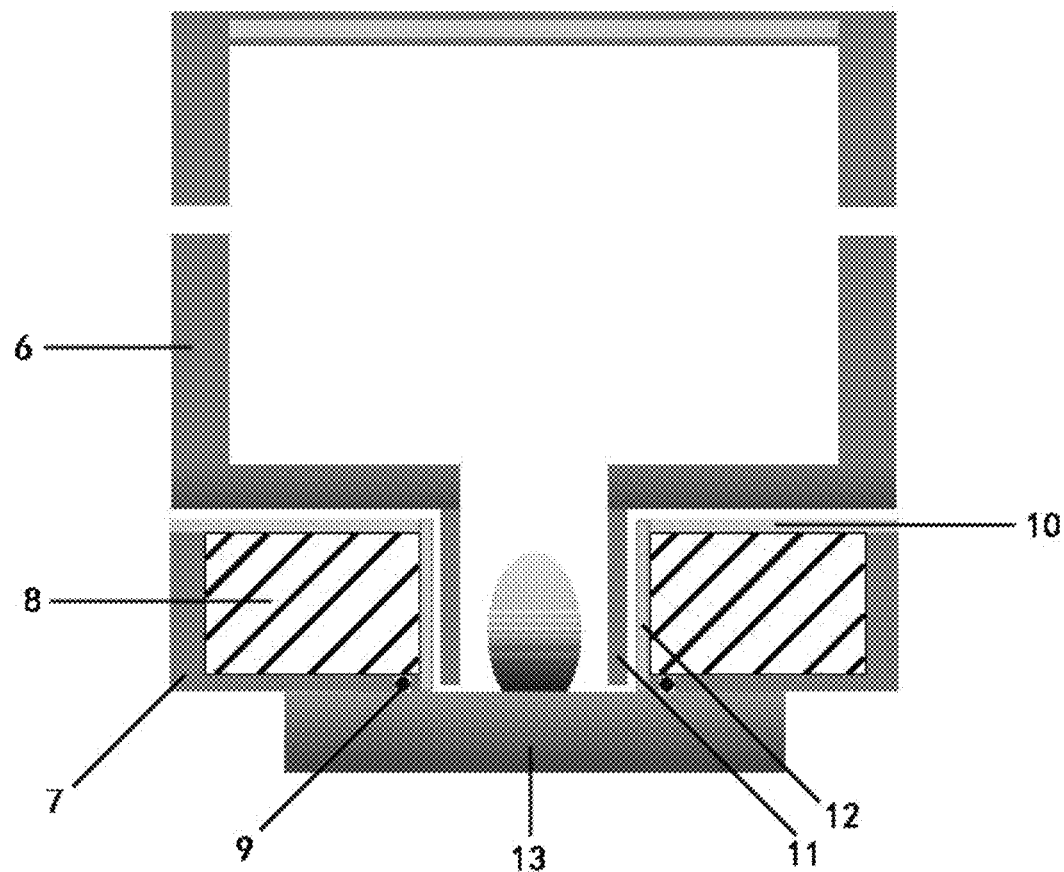
FIG. 4 is a structural schematic diagram of the glow discharge sputtering unit 1 of the present disclosure.

The glow discharge sputtering unit 1 achieves the flat and fast preparation with a large size of mm-cm level of the sample 13, and the controllable layer-by-layer preparation in the depth direction of the sample. As shown in FIG. 4, the glow discharge sputtering unit 1 includes a cavity 6, a cathode plate 7, a magnet 8, a sealing O-ring 9, an insulating plate 10, an anode tube 11, and a ceramic tube 12.

In the glow discharge sputtering unit 1, the sample 13 is used as a cathode. The sample 13 is brought into airtight contact with the cathode plate 7 of the glow discharge sputtering unit 1 by a sample jacking device. Through the sealing ring 9 on the cathode plate 7, the sample 13 forms a closed discharging space with the cavity 6 of the glow discharge sputtering unit. An internal discharging gas (such as argon gas) is introduced, and at the same time, dynamic balance is formed by pumping through a vacuum pump, and the gas pressure is maintained around a few hundred Pa. A sufficiently high voltage is applied between the two electrodes, which is generally 500-2000 V to form a glow discharge. The discharge gas ions (such as argon ions) reach the surface of the sample 13 under the acceleration of the electric field, uniformly sputter and erode layer-by-layer the atoms on the surface of the sample in a cathode sputtering manner to form a preparation of glow discharge sputtering on the sample.

The glow discharge sputtering unit 1 is provided with a replaceable anode tube (11) with different diameters (such as 4 mm, 8 mm, 12 mm, and is not limited thereto), a cathode plate 7 and a ceramic tube 12 matching the corresponding center inner diameter, so that the mm-cm level glow discharge sputtering sample preparation is realized.

Figure 2:
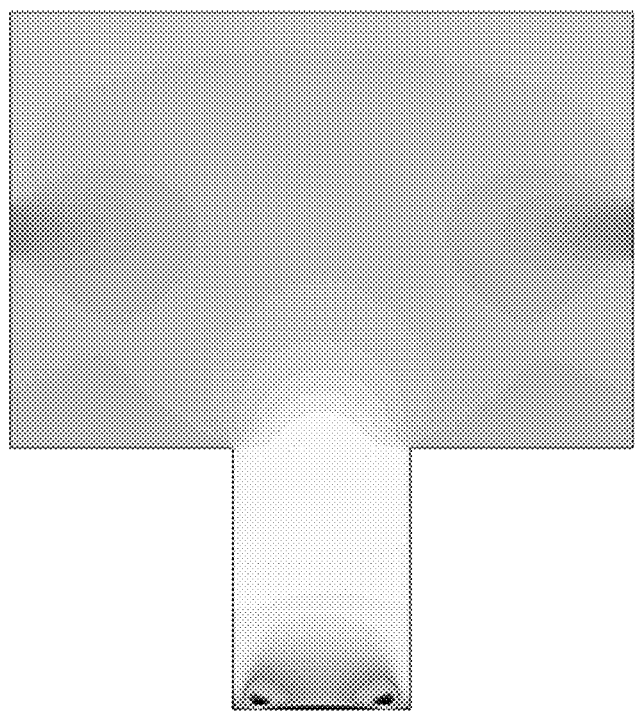
FIG. 2 is an overall gas pressure simulation distribution diagram of the glow discharge sputtering unit 1 of the present disclosure.

A distribution of the gas pressure in the cavity (6) of the glow discharge sputtering unit (1) is simulated by the fluid simulation module (as shown in FIG. 2), and the inlet position and inlet angle of the discharge gas (argon) of the cavity 6 of the glow discharge sputtering unit 1 is optimized respectively before the glow discharge sputtering unit 1 is designed and processed. In the actual sample preparation using the glow discharge sputtering unit 1, the flow rate of the discharge gas is optimized according to selected different sputtering preparation conditions. A non-uniformity of the distribution of the electric field in the glow discharge sputtering unit is counteracted, and a flat preparation of the sample surface in the size range of mm-cm level is realized.

Figure 3:
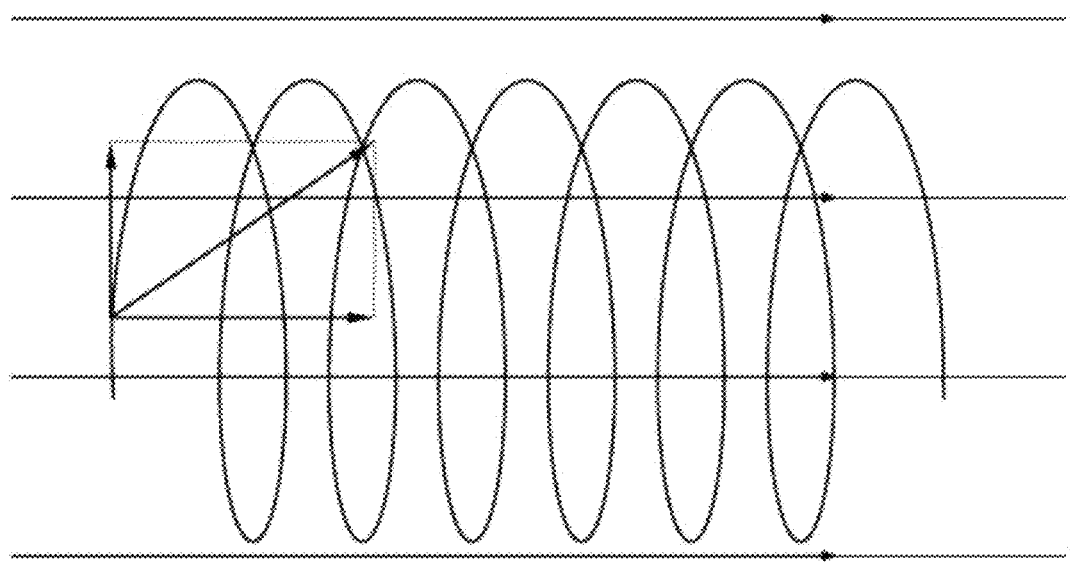
FIG. 3 is a schematic diagram of the movement path of charged particles in the magnetic field of the present disclosure.

An annular magnet 8 is added around the periphery of the anode tube 11, and the annular magnet 8 is placed on the insulating (ceramic) plate 10, and is pressed against the cathode tray 7, and the magnet 8 is surrounded between the insulating (ceramic) plate 10 and the cathode plate 7. The central axis of the annular magnet 8 coincides with the central axis of the anode tube 11, and the magnetic force line direction of the magnet 8 is perpendicular to the surface of the sputtering preparation sample 13. After a magnetic field and an electric field are applied, charged particles perform a spiral movement as follows: they make a circular motion perpendicular to the magnetic field, and move toward the surface of the sample 13 under the action of the electric field. The movement path of the charged particles in the anode tube 11 in the magnetic field is shown in FIG. 3.

The annular magnet (8) is a permanent magnet or an electromagnet. When the magnet 8 is a permanent magnet, the permanent magnet such as NdFeB and SmCo is selected according to different magnetic field intensities required. When the magnet 8 is an electromagnet, the electromagnet is a plurality of turns of annular coils, and the direction of the magnetic force line of the electromagnet is perpendicular to the surface of the sputtering preparation sample. The strength of the magnetic field can be adjusted by adjusting the electromagnetic current to obtain a more optimized flat sample sputtering preparation surface. The assembly top view of the annular magnet in the glow discharge sputtering unit is shown in FIG. 5.

Figure 5:
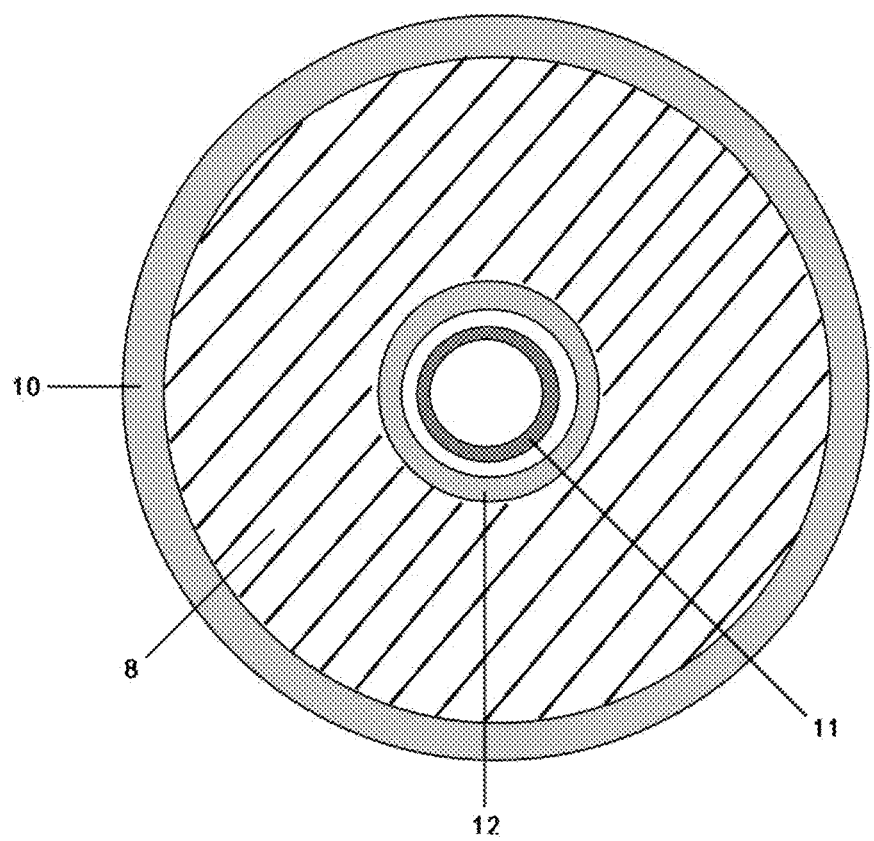
FIG. 5 is a top sectional view of FIG. 4 (without placing the sample 13 and mounting the cathode plate 7)

In FIG. 5, the positive electrode of the glow discharge power supply 2 is connected to the cavity 6 (as an anode) of the glow discharge sputtering unit 1 through a cable. The negative electrode of the glow discharge power supply 2 is connected to the sample 13 (as the cathode) through a cable. The glow discharge power supply 2 is a direct current power source or a radio frequency power source. The direct current power source includes an excitation control system, a negative high voltage generation system, a constant current control system, and the like. The radio frequency power source includes a radio frequency power source, a power matcher, a radio frequency power automatic control system, and the like. The glow discharge power supply 2 supplies energy to the glow discharge sputtering unit 1, forms and maintains the glow discharge plasma to stabilize and continue the glow discharge sputtering on the sample. The glow discharge power supply 2 and the gas circuit automatic control unit 3 cooperatively adjust the gas pressure in the cavity 6 of the glow discharge sputtering unit 1, so that preset discharge parameter values are reached, and a stable sputtering and a flat sample preparation surface are obtained.

Figure 6:
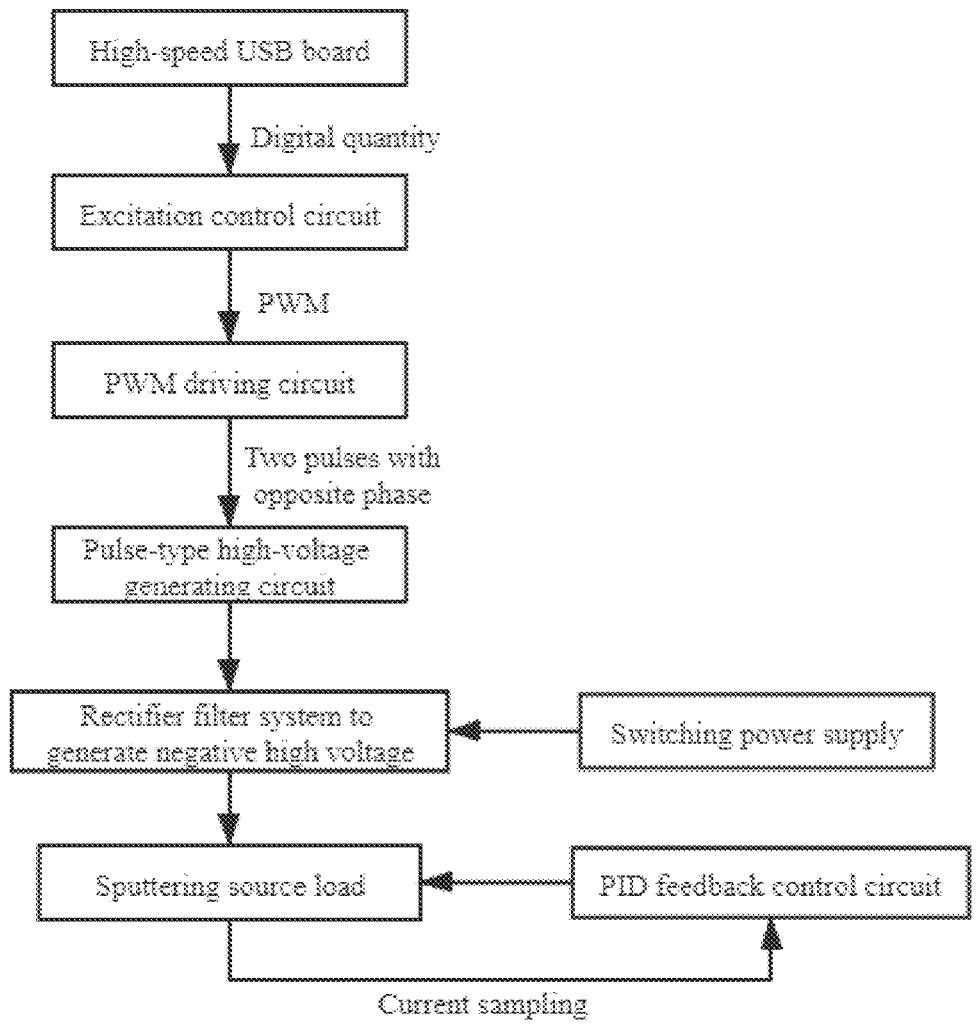
FIG. 6 is a schematic working flowchart of the glow discharge power supply 2 of the present disclosure.

In the direct current power supply mode, the direct current high voltage generated by the negative high voltage generation system is used for glow discharge sputtering samples, and the set discharge voltage is monitored in real time; and a DC constant current mode may be adopted, and a value of the set discharge voltage is maintained by adjusting the gas pressure in the cavity 6 of the glow discharge sputtering unit 1 rapidly. In the radio frequency power supply mode, the radio frequency power source applies a set radio frequency energy to the sample 13 via a cable; the glow discharge is generated and maintained by a self-bias voltage generated on the sample 13; the power matcher minimizes a reflected power by tuning; and a value of the set discharge power is maintained in combination with adjusting the gas pressure in discharge sputtering unit. A schematic workflow diagram of the direct current power supply mode of the glow discharge power supply 2 is shown as FIG. 6.

The high-speed USB board sends a 16-bit digital quantity to the excitation control circuit through an array line. Then the excitation control circuit generates a signal with a period of 2 ms and adjustable pulse width, and transmits the signal to the PWM driving circuit through an optical fiber. The PWM driving circuit processes the received pulse signal into two pulses with opposite phase and sends them to the gates of two IGBTs of the pulse-type high-voltage generating circuit respectively; the pulse-type high-voltage generating circuit is powered by the switching power, and the high voltage is generated by boosting and transmitted to the rectifier filter system to generate DC high voltage. The DC high voltage output is connected in series with the load of the glow discharge sputtering source to supply energy to the load of the glow discharge sputtering source. In a loop composed of the high voltage output and the glow load connected in series, current sampling is performed by a sampling resistor of a PID feedback control circuit, and a voltage signal collected on the sampling resistor is transmitted to the feedback control circuit to implement constant current control.

The gas circuit automatic control unit 3 includes a vacuum pump, a high pressure gas cylinder, a pressure relief valve, a vacuum gauge, an electromagnetic valve and a connecting pipe. The gas circuit automatic control unit 3 evacuates the cavity 6 of the glow discharge sputtering unit 1 by the vacuum pump; meanwhile, through the control of the electromagnetic valve, the inert discharge gas with the set flow rate is released, so that the gas pressure in the cavity 6 of the glow discharge sputtering unit 1 reaches a dynamic balance. The flow rate of the inert discharge gas is adjusted in real time to maintain set discharge parameter values (discharge current, discharge voltage/discharge power) during glow discharge sputtering, so that the stable operation of the sputtering unit during glow discharge sputtering is ensured. The flow rate of the inert discharge gas is generally controlled at 0.1-1.0 mL/min. During glow discharge sputtering, because of the change of the discharged load, the upper computer is used to monitor the set discharge voltage in real time. The gas flow into the cavity 6 of the glow discharge sputtering unit 1 is quickly adjusted by the electromagnetic valve in the gas circuit automatic control unit 3, so that the dynamic balancing gas pressure in the cavity 6 of the glow discharge sputtering unit 1 is changed, and the stability of discharge parameters such as the set discharge voltage is maintained. A schematic workflow diagram of the gas circuit automatic control unit 3 is shown in FIG. 7.

Figure 7:
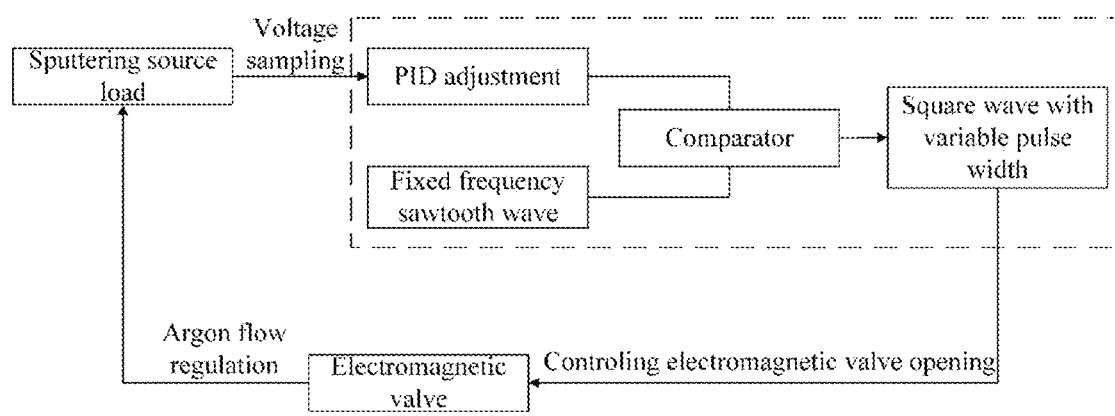
FIG. 7 is a schematic working flowchart of the gas circuit automatic control unit 3 of the present disclosure.

In FIG. 7, voltage sampling on the light source load of the glow discharge is performed. A certain amplitude analog signal output through PID adjustment and a fixed frequency sawtooth wave is respectively input to two ends of the comparator. With the change of the amplitude of the analog signal output by the PID, the sawtooth wave is cut into square waves with variable pulse width by the analog signal level. The opening degree of the electromagnetic valve is controlled to adjust the argon flow in the glow discharge sputtering unit. Thus, the dynamic balancing gas pressure in the glow discharge sputtering unit is changed.

The spectrometer 4 collects a spectral signal generated during the sample glow discharge sputtering in real time, and monitors an element signal condition in a depth direction of the sample sputtering. Precise preparation of different layer microstructures is realized in combination of the depth information of the glow discharge sputtering. Repeating glow discharge sputtering at the same position can prepare different sample surfaces in depth for reconstruction of the three-dimensional microstructure of the materials. Combined with a change of collected glow discharge spectrum signal over time, a change relationship of each element content with depth in the process of sample preparation is obtained by the computer 5 through a quantitative conversion model.

The computer 5 is configured to set discharge parameters of glow discharge sputtering, collect in real time discharge parameters such as a discharge voltage, a discharge current or a discharge power during glow discharge sputtering and a value of the gas pressure in the cavity of the unit, and display same on a computer display. The spectral signal, generated during sample glow discharge sputtering and collected by the spectrometer, is processed in real time, and is displayed in real time on the computer. Combined with a change of collected glow discharge spectrum signal over time, a change relationship of each element content with depth in the process of sample preparation is obtained by the computer 5 through a quantitative conversion model.

EMBODIMENT

The nickel-based single crystal superalloy sample is prepared with the apparatus of the present disclosure for preparing glow discharge sputtering samples for materials microscopic characterization. The operation steps are as follows.

Sample preparation: the sample is cutting into a dimension not less than 20 mm, and completely covers the anode tube of the glow discharge sputtering apparatus and the sealing O-ring on the cathode plate. If the sample is too small, the sample needs to be inlaid in high temperature with conductive resin, so that normal sputtering of the sample is ensured. The cut sample is ground and polished successively to obtain a flattened and cleaned sample surface to be used.

Figure 8:
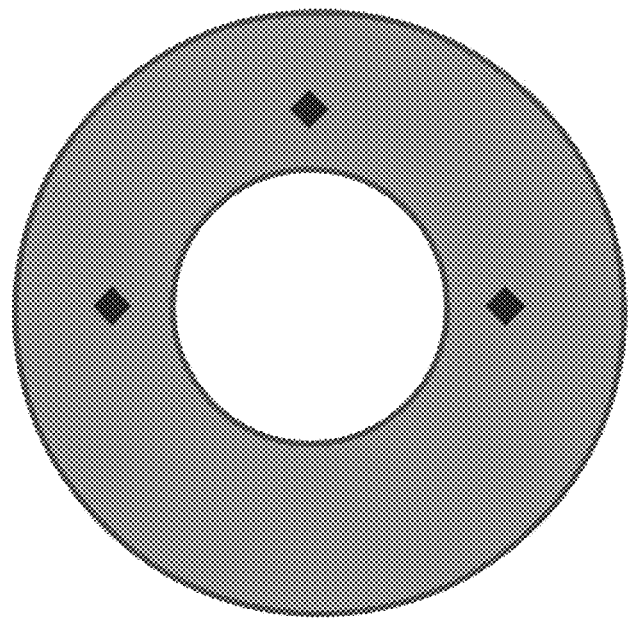
FIG. 8 is a schematic diagram of the sample position marks of the present disclosure.

The prepared sample may be marked with a microhardness tester, as shown in FIG. 8. The width of the mark point is about 30 μm. The coordinates of each marking point can be accurately acquired when the hardness point is made by the microhardness tester. Depending on the information of the position mark point, the sample preparation surface two-dimensional coordinates (x, y) can be obtained. The coordinate information (z) in the depth direction is obtained by combining the measurement of the sample sputtering rate and the set sputtering time. Thus, the surface spatial coordinates of the sample preparation are obtained. Combined with specific microstructure characterization technology, the corresponding relationship between the surface space coordinates of the sample preparation surface and the microstructure may be established.

For different types of materials samples, discharge parameters such as discharge voltage, discharge current/discharge power, etc. of glow discharge sputtering of the sample can be further optimized to obtain a flatter sputtering preparation surface for microstructure characterization.

The units are connected to each other in the above manner, the power supply is turned on, and the apparatus is stably preheated. Then, the relevant parameters of glow discharge sputtering, such as discharge voltage, discharge current/discharge power and sputtering time, etc., are set.

Figure 9:
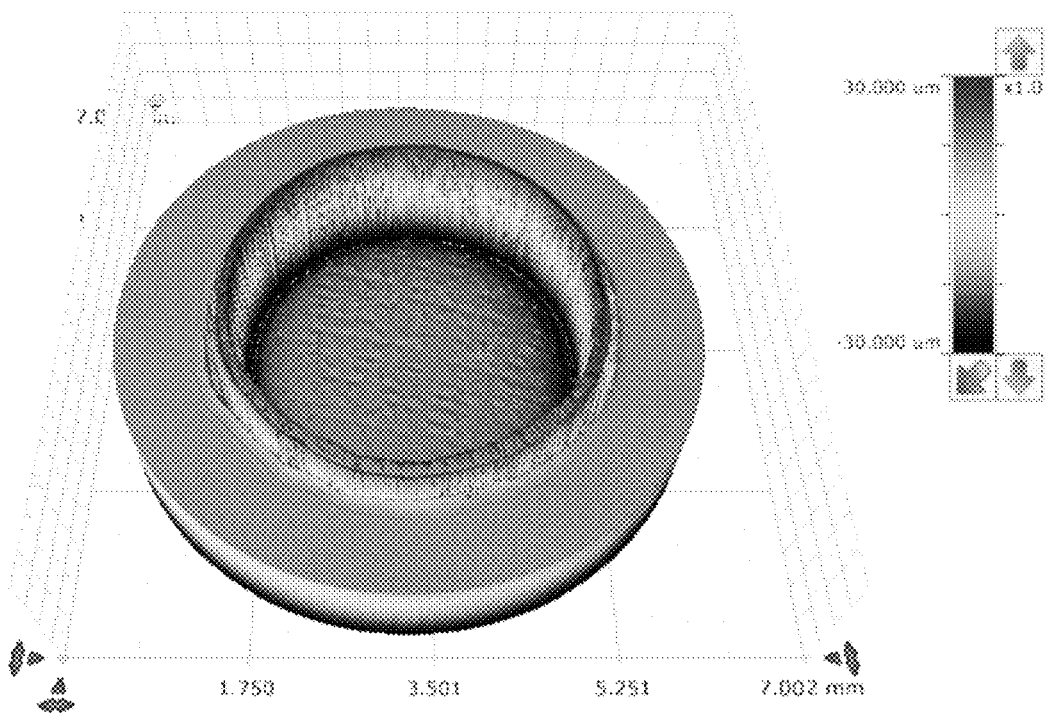
FIG. 9 is a diagram of a crater formed by sample preparation of glow discharge sputtering of the present disclosure.
Figure 10:
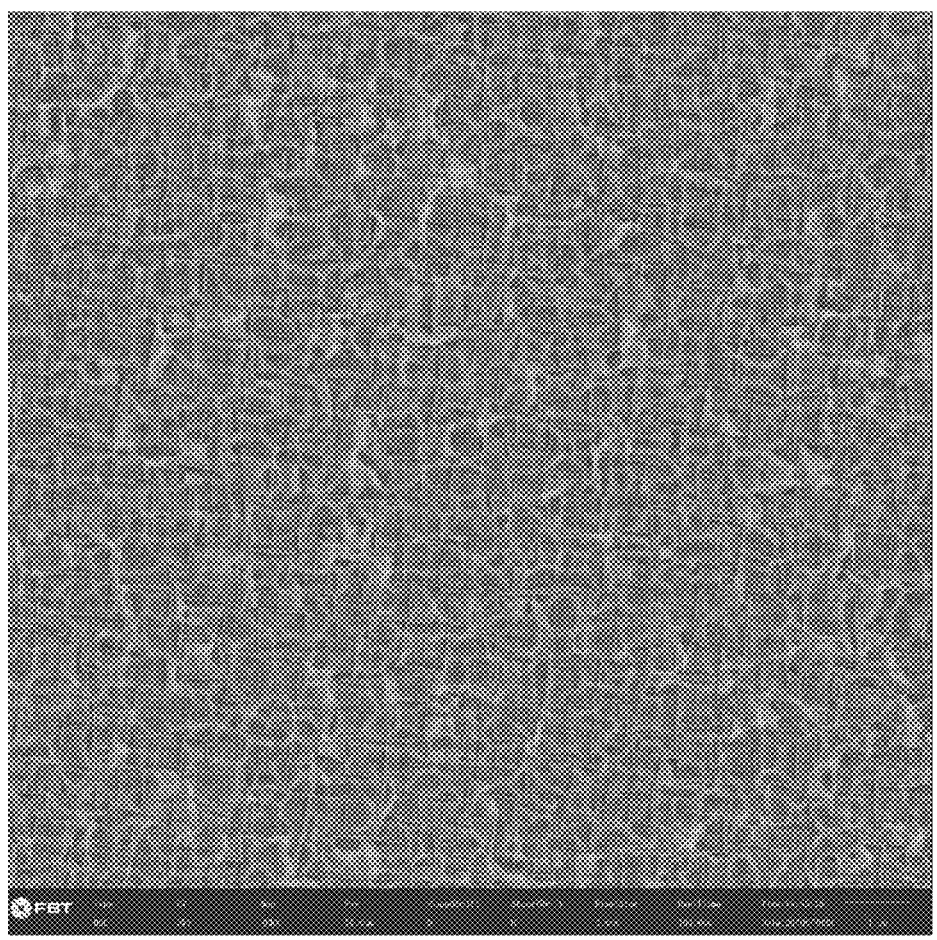
FIG. 10 is a scanning electron microscopic partial backscattered electron image of sample preparation of glow discharge sputtering of the present disclosure (20,000 magnification, nickel-based single crystal superalloy).

The sample is put into the glow discharge sputtering unit. The glow discharge light source vacuumizes and introduces discharge gas at a set flow. After the gas pressure balance is reached and the discharge parameters are set, the glow discharge plasma is formed and the samples are sputtered. The sputtering is stopped after reaching the sample preparation time. At the same time, the samples can be prepared layer by layer along the depth direction at the same position. The crater shape on the surface of the sample prepared by glow discharge sputtering is shown as FIG. 9, and the partial backscattered electron image of the sample prepared by glow discharge sputtering is shown as FIG. 10.

The spectrometer collects a spectral signal generated during the sample glow discharge sputtering in real time, and monitors an element signal condition in a depth direction of the sample sputtering. According to the need of preparing samples to characterize the microstructure, the glow discharge sputtering can be stopped immediately to realize the accurate preparation of different layer microstructure. The surface of samples with different depths can be prepared by repeated glow discharge sputtering at the same position to reconstruct the three-dimensional microstructure of the materials.

What is claimed is:

1. An apparatus for preparing glow discharge sputtering samples for materials microscopic characterization, comprising: a glow discharge sputtering unit, a glow discharge power supply, a gas circuit automatic control unit, a spectrometer, and a computer;
    wherein the glow discharge sputtering unit comprises a cavity, a cathode plate, a magnet, a sealing ring, an insulating plate, an anode tube, and a ceramic tube;
    a sample is in airtight contact with the cathode plate of the glow discharge sputtering unit as a cathode, and the cavity forms a closed discharge space;
    the magnet is annular and arranged outside the anode tube through the ceramic tube, and the magnet is located and embraced between the insulating plate and the cathode plate;
    a positive electrode and a negative electrode of the glow discharge power supply are electrically connected to the cavity of the glow discharge sputtering unit and the sample, respectively;
    the gas circuit automatic control unit is connected to the cavity of the glow discharge sputtering unit via a gas pipeline, and evacuates the cavity and introduces an inert discharge gas at a certain flow rate;
    the spectrometer is connected to the glow discharge sputtering unit through a light guide device, and collects a spectral signal generated during a glow discharge sputtering of the sample in real time, and monitors elements signal condition in a depth direction of the sample sputtering, so that precise preparation of different layer microstructures is realized;
    the computer is respectively connected to the glow discharge power supply, the gas circuit automatic control unit and the spectrometer, and is used for setting discharge parameters of glow discharge sputtering, collecting and displaying the discharge parameters during glow discharge sputtering and a gas pressure value in the cavity of the glow discharge sputtering unit in real time, and processing and displaying the spectral signal generated during the glow discharge sputtering of the sample and collected by the spectrometer in real time;
    a central axis of the magnet coincides with a central axis of the anode tube; the direction of a magnetic force line of the magnet is perpendicular to a surface of the sample; and after a magnetic field and an electric field are applied, charged particles perform a spiral movement as follows: the charged particles make a circular motion perpendicular to the magnetic field, and move toward the surface of the sample under the action of the electric field;
    a fluid simulation module; wherein the fluid simulation module simulates a distribution of the gas pressure in the cavity of the glow discharge sputtering unit; a gas inlet position, a gas inlet angle and a gas flow rate of the cavity are optimized according to a simulation result, so that a non-uniformity of a distribution of the electric field in the glow discharge sputtering unit is counteracted, and a flat preparation of the sample surface is realized, wherein the sample is in mm or cm scale.

2. The apparatus of claim 1, wherein the glow discharge power supply and the gas circuit automatic control unit cooperatively adjust the gas pressure in the cavity of the glow discharge sputtering unit, so that preset discharge parameter values are reached, and a flat sample preparation surface is obtained.

3. The apparatus of claim 1, wherein the anode tube has a diameter between 2 mm and 20 mm, wherein the anode tube may be replaced with different anode tubes having different diameters between 2 mm and 20 mm, so that a mm-cm level glow discharge sputtering sample preparation is realized, and wherein mm-cm level means the sample is in mm or cm scale.

4. The apparatus of claim 1, wherein the glow discharge power supply is a direct current power source or a radio frequency energy source; the direct current power source comprises an excitation control system, a negative high voltage generation system and a constant current control system; and the radio frequency energy source comprises a radio frequency power source, a power matcher, and a radio frequency power automatic control system.

5. The apparatus of claim 4, wherein when the glow discharge power supply is a direct current power source, a direct current high voltage generated by the negative high voltage generation system is used for glow discharge sputtering samples, and a preset discharge voltage is monitored in real time; and a DC constant current mode is adopted, and a value of the preset discharge voltage is maintained by adjusting the gas pressure in the cavity of the glow discharge sputtering unit.

6. The apparatus of claim 4, wherein when the glow discharge power supply is the radio frequency power source, the radio frequency power source applies a preset radio frequency energy to the sample via a cable; a glow discharge for the glow discharge sputtering is generated and maintained by a self-bias voltage generated on the sample; the power matcher minimizes a reflected power by tuning; and a value of a preset discharge power is maintained in combination with adjusting the gas pressure in the cavity of the glow discharge sputtering unit.

7. The apparatus of claim 1, wherein the gas circuit automatic control unit comprises a vacuum pump, a high pressure gas cylinder, a pressure relief valve, a vacuum gauge, an electromagnetic valve, and a connecting pipe; the gas circuit automatic control unit evacuates the cavity of the glow discharge sputtering unit by the vacuum pump; meanwhile, through a control of the electromagnetic valve, the inert discharge gas with a preset flow rate is released, so that the gas pressure in the cavity of the glow discharge sputtering unit reaches a dynamic balance.

8. The apparatus of claim 1, wherein combined with a change of glow discharge spectrum signal over time collected by the spectrometer, a change relationship of each element content with depth in the process of sample preparation is obtained by the computer through a quantitative conversion model.

9. The apparatus of claim 1, wherein the magnet is a permanent magnet or an electromagnet.

10. The apparatus of claim 1, wherein the sealing ring is provided on a contact surface between the cathode plate and the sample.

11. The apparatus of claim 1, wherein the insulating plate is made of ceramic, polytetrafluoroethylene or epoxy resin.

12. The apparatus of claim 1, wherein the gas pressure value in the cavity is 100-1000 Pa.

13. The apparatus of claim 1, wherein a voltage between the cathode and the anode tube of the glow discharge sputtering unit is 500-2000 V.

14. The apparatus of claim 1, wherein the flow rate of the inert discharge gas into the cavity is 0.1-1.0 mL/min.

15. The apparatus of claim 1, wherein the anode tube and the cathode plate are separated from each other by the ceramic tube along a horizontal direction.

* * * * *